US007242456B2

(12) United States Patent
Ryzhikov et al.

(10) Patent No.: US 7,242,456 B2
(45) Date of Patent: Jul. 10, 2007

(54) SYSTEM AND METHOD UTILIZING A LITHOGRAPHY TOOL HAVING MODULAR ILLUMINATION, PATTERN GENERATOR, AND PROJECTION OPTICS PORTIONS

(75) Inventors: Lev Ryzhikov, Norwalk, CT (US); Yuli Vladimirsky, Weston, CT (US); Lev Sakin, Stamford, CT (US)

(73) Assignee: ASML Holdings N.V., Veldhoven (NL)

( * ) Notice: Subject to any disclaimer, the term of this patent is extended or adjusted under 35 U.S.C. 154(b) by 183 days.

(21) Appl. No.: 10/853,558

(22) Filed: May 26, 2004
(Under 37 CFR 1.47)

(65) Prior Publication Data
US 2005/0264782 A1   Dec. 1, 2005

(51) Int. Cl.
G03B 27/52 (2006.01)
G03B 27/42 (2006.01)
G03B 27/54 (2006.01)
(52) U.S. Cl. ............................ 355/55; 355/53; 355/67
(58) Field of Classification Search ................. 355/55, 355/53, 67; 250/548, 492.2; 345/694; 347/256; 359/290, 291, 298; 430/22
See application file for complete search history.

(56) References Cited

U.S. PATENT DOCUMENTS

| 5,229,872 | A | 7/1993 | Mumola |
| 5,296,891 | A | 3/1994 | Vogt et al. |
| 5,500,736 | A | 3/1996 | Koitabashi et al. |
| 5,523,193 | A | 6/1996 | Nelson |
| 5,530,482 | A | 6/1996 | Gove et al. |
| 5,579,147 | A | 11/1996 | Mori et al. |
| 5,617,211 | A | 4/1997 | Nara et al. |
| 5,677,703 | A | 10/1997 | Bhuva et al. |
| 5,691,541 | A | 11/1997 | Ceglio et al. |
| 5,801,811 | A | 9/1998 | Lo et al. |
| 5,808,797 | A | 9/1998 | Bloom et al. |
| 5,973,863 | A | 10/1999 | Hatasawa et al. |
| 5,982,553 | A | 11/1999 | Bloom et al. |
| 6,133,986 | A | 10/2000 | Johnson |
| 6,177,980 | B1 | 1/2001 | Johnson |
| 6,425,669 | B1 | 7/2002 | Kanatake et al. |

(Continued)

FOREIGN PATENT DOCUMENTS

EP    1 482 373 A1    12/2004

(Continued)

OTHER PUBLICATIONS

European Search Report, dated Apr. 19, 2006, for European Patent Application No. 05257490.2, 8 pages.

*Primary Examiner*—Peter B. Kim
(74) *Attorney, Agent, or Firm*—Sterne Kessler Goldstein & Fox PLLC (57) ABSTRACT

A lithography system has a magnification module having multiple magnifications at a same time within an object plane, which can include a pattern generator therein. The pattern generator is used to pattern light from an illumination system, which is directed by a projection optical system onto a substrate to form features on a substrate. Having multiple magnifications in the object plate allows for patterning of both large and small features on an image plane, which can include the substrate therein. In one example, an array of pattern generators are used. In this example, substantially an entire surface of the substrate can be patterned with large and small features at substantially a same time.

25 Claims, 8 Drawing Sheets

U.S. PATENT DOCUMENTS

| | | |
|---|---|---|
| 6,473,237 B2 | 10/2002 | Mei |
| 6,509,955 B2 | 1/2003 | Mei et al. |
| 6,552,775 B1 | 4/2003 | Yanagihara et al. |
| 6,556,278 B1 * | 4/2003 | Tanaka et al. .............. 355/67 |
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 6,847,461 B1 | 1/2005 | Latypov et al. |
| 6,967,711 B2 | 11/2005 | Gui |
| 7,095,568 B2 | 8/2006 | Kobayashi et al. |
| 2001/0048515 A1 | 12/2001 | Mei |
| 2002/0006561 A1 | 1/2002 | Taniguichi |
| 2002/0012858 A1 * | 1/2002 | Kawakubo et al. ........... 430/22 |
| 2003/0011756 A1 | 1/2003 | Omura et al. |
| 2003/0063366 A1 | 4/2003 | Hunt |
| 2003/0206281 A1 | 11/2003 | Jain |
| 2003/0233528 A1 | 12/2003 | Ishikawa et al. |
| 2004/0041104 A1 | 3/2004 | Liebregts et al. |
| 2004/0130561 A1 | 7/2004 | Jain |
| 2004/0159636 A1 | 8/2004 | Sandstrom et al. |
| 2005/0007572 A1 | 1/2005 | George et al. |
| 2005/0068599 A1 | 3/2005 | Mushika |
| 2005/0168790 A1 | 8/2005 | Latypov et al. |
| 2005/0264782 A1 | 12/2005 | Ryzhikov et al. |
| 2006/0012766 A1 | 1/2006 | Klosner et al. |
| 2006/0132742 A1 | 6/2006 | Van Der Mast et. al. |

FOREIGN PATENT DOCUMENTS

| | | |
|---|---|---|
| WO | WO 98/33096 | 7/1998 |
| WO | WO 98/38597 | 9/1998 |

* cited by examiner

SYSTEM AND METHOD UTILIZING A LITHOGRAPHY TOOL HAVING MODULAR ILLUMINATION, PATTERN GENERATOR, AND PROJECTION OPTICS PORTIONS

BACKGROUND OF THE INVENTION

1. Field of the Invention

The present invention is related to a lithography system.

2. Background Art

Pattern generators are used in lithography systems to pattern substrates during an exposure process. Example lithography systems include, but are not limited to, reflective or transmissive maskless, immersion, and photolithography system. Example substrates include, but are not limited to, semiconductor wafers, flat panel display substrates, flexible substrates, and the like. Light interacting with an illumination spot on the pattern generator becomes patterned. The patterned light is projected using a projection optical system onto one or more target areas of the substrate during the exposure process to form features on the substrate.

Figure 14:
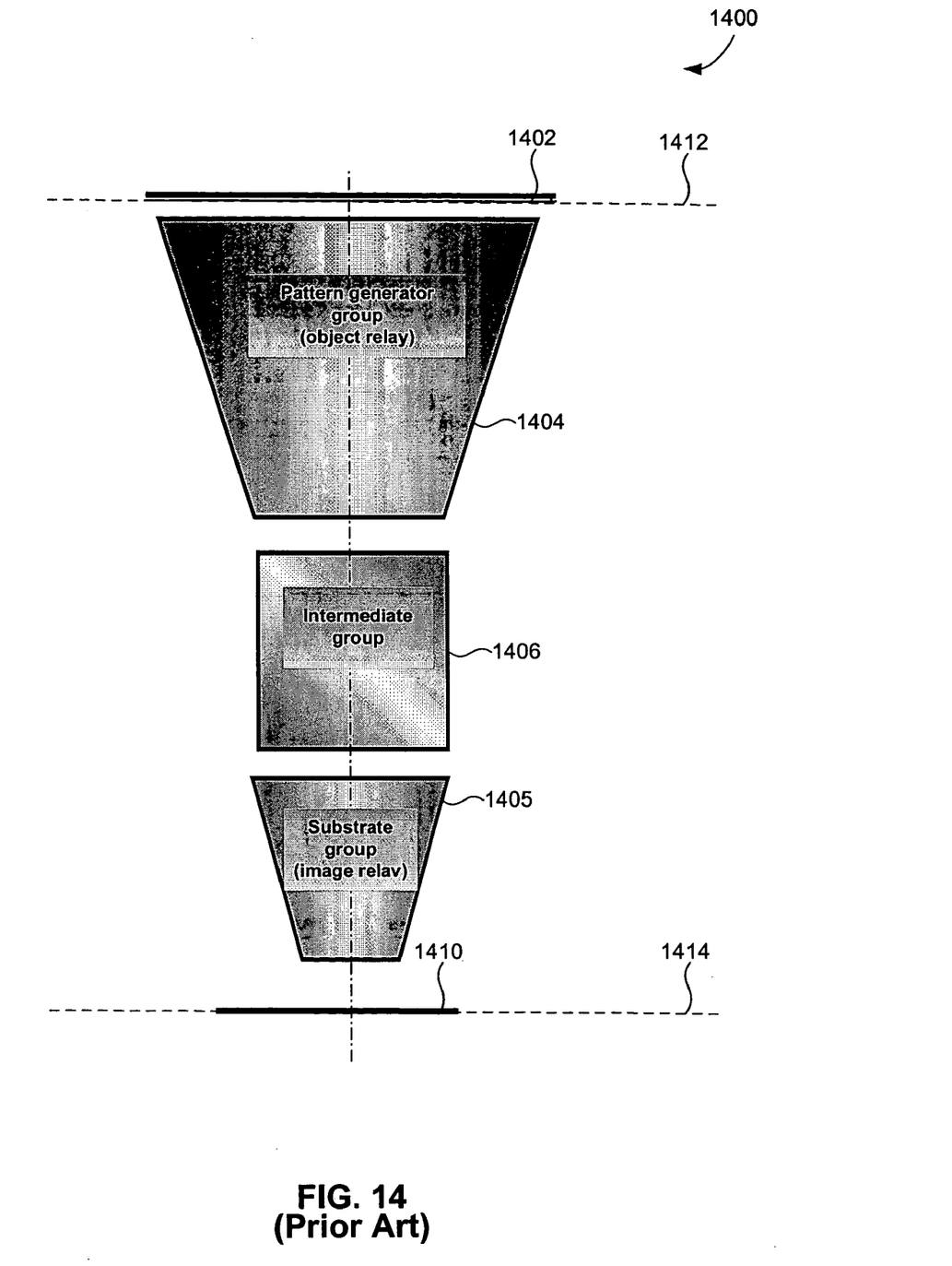
FIG. 14 shows a portion of a conventional lithography system.

FIG. 14 shows a portion of a conventional lithography system 1400. System 1400 includes pattern generator 1402 that directs patterned light through a pattern generator group of optical elements 1404, an intermediate group of optical elements 1406, a substrate group of optical elements 1408, and onto a substrate 1410. System 1400 includes a fixed magnification at an object plane 1412 and a fixed distance between object plane 1412 and an image plane 1414. For semiconductor fabrication this was possible because both pattern generator 1402 and substrate 1410 had relative sizes that allowed for a fixed magnification and distance.

However, for flat panel display fabrication using a fixed magnification is no longer desirable because in flat panel display fabrication substrate 1410 is typically many times larger than a size of pattern generator 1402. For example, in flat panel display fabrication pattern generator 1402 can have 1 million pixel areas or active areas, while substrate 1410 can have billions or trillions of pixels areas of the same size. Thus, in flat panel display fabrication substrate 1410 can be about 3 to 6 orders of magnitude larger than pattern generator 1402. Having a fixed magnification results in only being able to pattern one sized feature at a time, which substantially decreases throughput. Throughput is low because various sets of features have different sizes, and with a fixed magnification only one size feature can be pattern during a single exposure.

Therefore, what is needed is a lithography system and method that allow for an increased throughput through patterning of all feature sizes in during each exposure, possibly patterning features over an entire surface of a substrate substantially at a same time. What is also needed is a lithography system and method that can allow for various magnifications, numerical apertures, resolutions, and/or working distances between various parts of the lithography system.

BRIEF SUMMARY OF THE INVENTION

An embodiment of the present invention provides a system including first through fourth modules. The first module includes a set of pattern generating devices. The second module includes a set of magnification changing devices. In one embodiment, the first and second module can be combined as a single pattern generator system module. The third module includes a set of illuminating devices. The fourth module includes a set of projection optical devices.

Another embodiment of the present invention provides a system including a set of pattern generating devices and a set of magnification changing devices. In this embodiment, there are a same number of magnification changing devices as pattern generating devices in the set of pattern generating devices. A characteristic of each of the pattern generating devices is used to choose which of the magnification changing devices is to be aligned with respective ones of the pattern generators.

A still further embodiment of the present invention provides a system including a device for pattering light that forms multiple columns of patterned light from light received from an illumination system, a device for changing magnification that changes magnification in each of the columns of patterned light, and a device for patterning a substrate that directs the columns of pattered light onto exposure areas on the substrate.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

One or more embodiments of the present invention provide a lithography system that has a magnification module having multiple magnifications at a same time within an object plane, which can include a pattern generator therein. The pattern generator is used to pattern light from an illumination system, which is directed by a projection optical system onto a substrate to form features on a substrate. Having multiple magnifications in the object plate allows for patterning of both large and small features on an image plane, which can include the substrate therein.

In one embodiment, an array of pattern generators are used. In this embodiment, substantially an entire surface of the substrate can be patterned with large and small features at substantially a same time.

The module scheme used according to one or more embodiments of the present invention can extend the useable life of a lithography tool because each module can be replaced or interchanged with different or newer modules to allow for continued use of one lithography tool for many more years than conventionally allowed.

Throughout the description, the use of the terms "pattern generator" and "pattern generating devices" includes a reflective and transmissive reticle, a contrast device, a liquid crystal display, a spatial light modulator, a grating light valve, a digital mirror device, or any other device that can be used to impart a pattern onto a light beam, as will become apparent to one or ordinary skill in the art upon reading this description.

Also, the use of "system" or "lithography system" is meant to include photolithography, direct write lithography, maskless lithography, immersion lithography, and the like.

Further, the use of "light" or "radiation" is meant to include any wavelength desired for a particular application.

Overview

As discussed above, during lithography, a substrate, which is disposed on a substrate stage, is exposed to an image (e.g., a pattern) formed by a pattern generator, or an array thereof. The image is projected onto the surface of the substrate by exposure optics located within a lithography apparatus. While exposure optics are used in the case of lithography, a different type of exposure apparatus can be used depending on the particular application. For example, an excimer laser, x-ray, ion, electron, or photon lithography can each require a different exposure apparatus, as is known to those skilled in the art. The particular example of photolithography is discussed here for illustrative purposes only.

Pattern generators are used in lithography systems to pattern light, which forms images that are used to form features on a substrate. Such substrates can include those used in the manufacture of flat panel displays (e.g., liquid crystal displays), circuit boards, various integrated circuits, and the like. A frequently used substrate for such applications is a semiconductor wafer or flat panel display glass substrate. While a portion this description is written in terms of a semiconductor wafer for illustrative purposes, one skilled in the art would recognize that this description also applies to other types of substrates known to those skilled in the art. Typically, reticles (or masks), spatial light modulators (SLMs) or contrast devices (hereinafter, both are referred to as SLMs), such as digital mirror devices (DMDs), liquid crystal displays (LCDs), grating light valves (GLVs), or the like, or any other elements that include a transmissive and/or reflective pattern can be used as pattern generators.

A pattern generator can include an active area having an nxm (wherein n and m are integers greater than 1) array of active devices (or pixels). For example, active areas can include, but are not limited to, an array of mirrors on the DMD, an array of gratings on a GLV, or an array of reflective/transmissive devices on the LCD. Each active device is individually controlled to move the active devices between ON and OFF through one or more discrete states. For example, if the active devices are mirrors on the DMD, each of the mirrors is individually controlled to rotate or tilt the mirror to either binary or multiple positions. As another example, if the active devices are strips in a GLV, sets of strips can be bent or straightened to allow reflection or diffraction of incoming light beams.

It is to be appreciated that controlling the active devices in the active areas so that they are partially or fully ON or OFF is well known in the art, and not fully described here for brevity. Typically, a predetermined and previously stored algorithm based on a desired exposure pattern is used to turn ON (or partially ON) and OFF the active devices, as is known in the relevant arts.

The projected image produces changes in the characteristics of a layer (e.g., photoresist) deposited on the surface of the substrate. These changes correspond to features in the image projected onto the substrate during exposure. Subsequent to exposure, the layer can be etched to produce a patterned layer. The pattern corresponds to the features projected onto the substrate during exposure. This patterned layer is then used to remove or further process exposed portions of underlying structural layers within the substrate, such as conductive, semiconductive, or insulative layers. This process is then repeated, together with other steps, until the desired features have been formed on the surface, or in various layers, of the substrate.

Step-and-scan technology works in conjunction with a projection optics system that has a narrow imaging slot. Rather than expose the entire substrate at one time with the image formed by the pattern generator, individual fields are scanned onto the substrate one at a time through an imaging slot. This is accomplished by moving the substrate and controlling active devices on the pattern generator, such that the imaging slot is moved across the field during the scan. The substrate stage is then stepped between field exposures to allow multiple copies of the pattern formed by the active devices on the pattern generator to be exposed over the substrate surface. In this manner, the quality of the image projected onto the substrate is maximized.

Overall System

Figure 1:
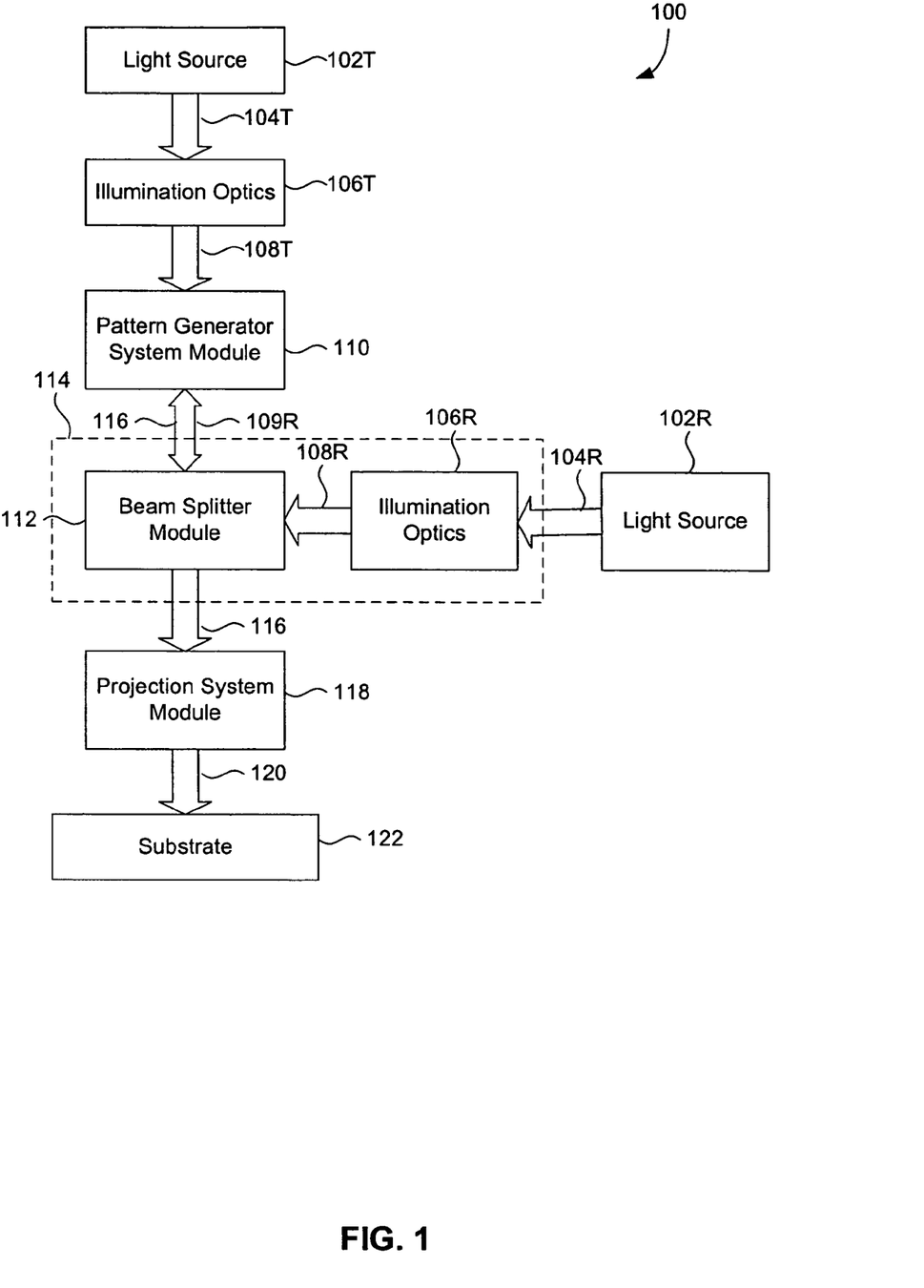
FIG. 1 shows a lithography system, according to one embodiment of the present invention.

FIG. 1 shows a lithography system 100, according to respective embodiments of the present invention. System 100 shows two possible embodiments, a reflective pattern generator application and a transmissive pattern generator application. Both are contemplated within the scope of the present invention. For example, when an array of pattern generators is being used, some can be reflective and some can be transmissive, or they can all be reflective or transmissive depending on the desired use of the lithography system 100.

Throughout this description, a designation of T is for a transmissive pattern generator and designation of R is for a reflective pattern generator.

A light source 102 (or radiation source) generates illumination 104 which is processed in illumination optics 106. The illumination optics 106 can be various combinations of lenses, mirrors, and the like. Illumination 108T reaches pattern generator system module 110 directly or illumination 109R reaches pattern generator system module 110 via a beam splitter module 112. Pattern generator system module 110 includes pattern generators, magnification systems, and optionally, optical devices. In one embodiment, beam splitter module 112 and illumination optics 106R are combined in an intermediate module 114, shown as dashed lines in FIG. 1. Patterned light 116, which is patterned using pattern generator system module 110, is processed in projection system module 118 and processed light 120 forms features on substrate 122.

It is to be appreciated that each module is capable of being replaced because of defects or when parts become worn, or each module can be switched with interchangeable parts, such that an overall lithography system's useful life can be substantially extended or be adapted for use with newer generations of modules.

Exemplary Light Sources

FIGS. 2, 3, 4, and 5 show various arrangements for light source 102, according to respective embodiments of the present invention. It is to be appreciated that although some are shown as including both a light source and optical elements, the optical elements can be located in illumination optics 106 depending on a desired application of system 100.

Throughout this description, the use of "light source" or "illumination device" includes any device capable of generating light at a desired wavelength, for example ultra violet, deep ultra violet, extreme ultra violet, x-ray, or other wavelengths desired for a particular application of system 100.

Figure 2:
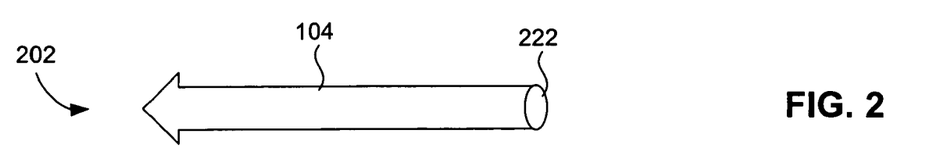
FIGS. 2, 3, 4, and 5 show light sources, according to respective embodiments of the present invention.

FIG. 2 shows light source 202, according to one embodiment of the present invention. Light source 202 includes a single illumination device 222 generating a single beam of radiation 104.

Figure 3:
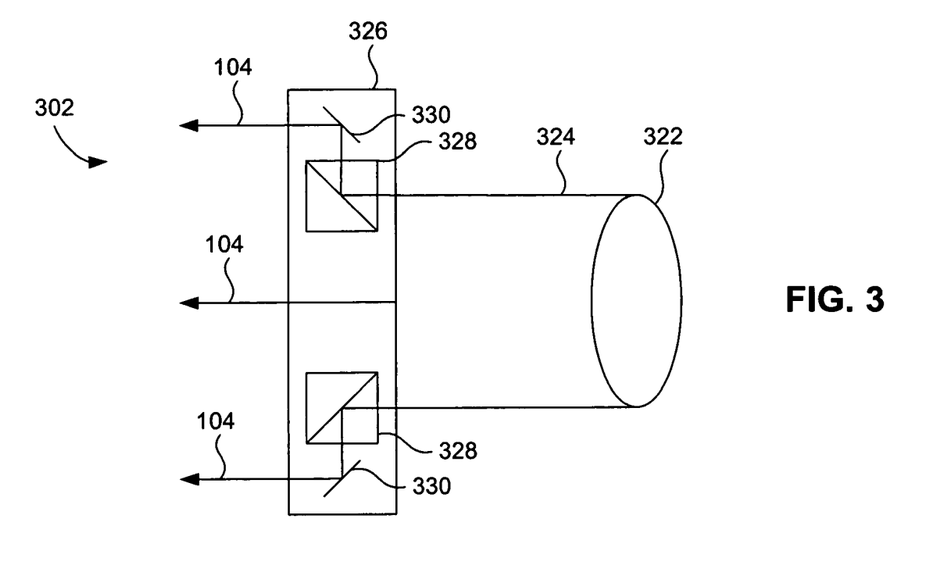

FIG. 3 shows light source 302, according to one embodiment of the present invention. Light source 302 includes a single illumination device 322 generating a light beam 324 which is used to form multiple light beams 104 using an optical divider 326. Optical divider 326 can include optical directing elements 328 (e.g., beam splitters) that direct portions of beam 324 towards reflective devices 330 (e.g., mirrors), which form beams 104. It is to be appreciated that although only two directing and reflecting elements 328 and 330, respectively, are shown to produce three beams 104 from beam 324, any number of optical elements 328 and/or 330 can be used to generate a desired number of beams 104, depending on a particular application of light source 302, and all are contemplated within the scope of the present invention.

Figure 4:
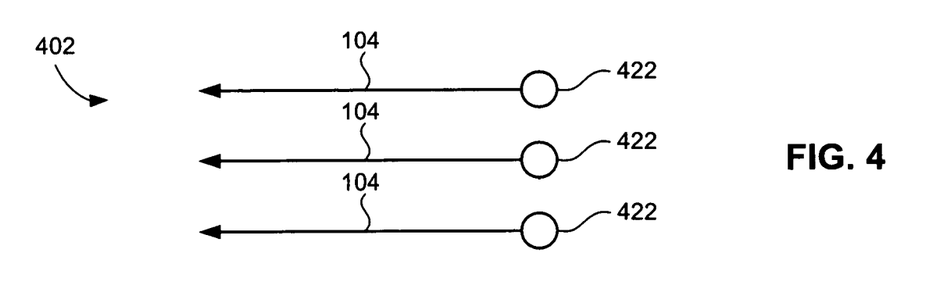

FIG. 4 shows light source 402, according to one embodiment of the present invention. Light source 402 includes a plurality of illumination devices 422 that generate multiple beams 104. Illumination devices 422 can generate a same or different wavelength of light depending on a particular application of light source 402. It is to be appreciated that, even though only three illumination devices 422 are shown, any number can be used, as is contemplated within the scope of the present invention.

Figure 5:
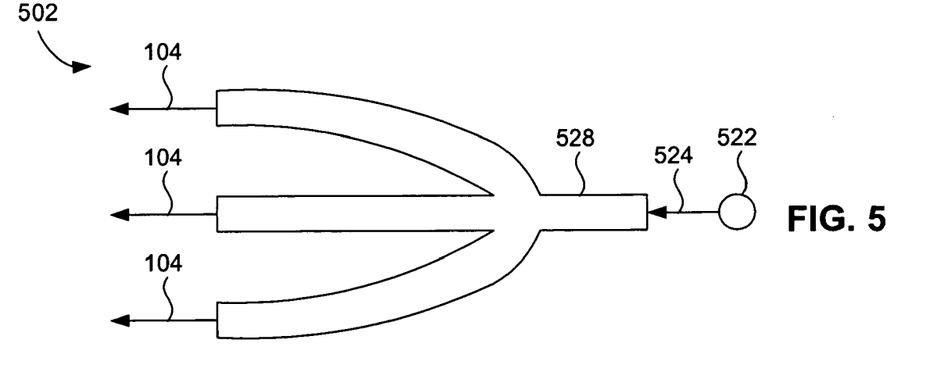

FIG. 5 shows light source 502, according to one embodiment of the present invention. Light source 502 includes a single illumination device 522 that generates a beam 524 that enters an end of an optical divider 528. For example, optical divider 528 can be, but is not limited to, a waveguide, a fiber optic, or the like having a single in multiple out configuration. Optical divider 528 forms multiple beams 104, where only three are shown in FIG. 5, any number can be used as is contemplated within the scope of the present invention.

It is to be appreciated that these are not the only configurations for light source 102, as others, such as combinations of arrangements in FIGS. 2–5, would become apparent to one of ordinary skill in the art upon reading and understanding the present invention.

Exemplary Beam Splitter Modules

Figure 6:
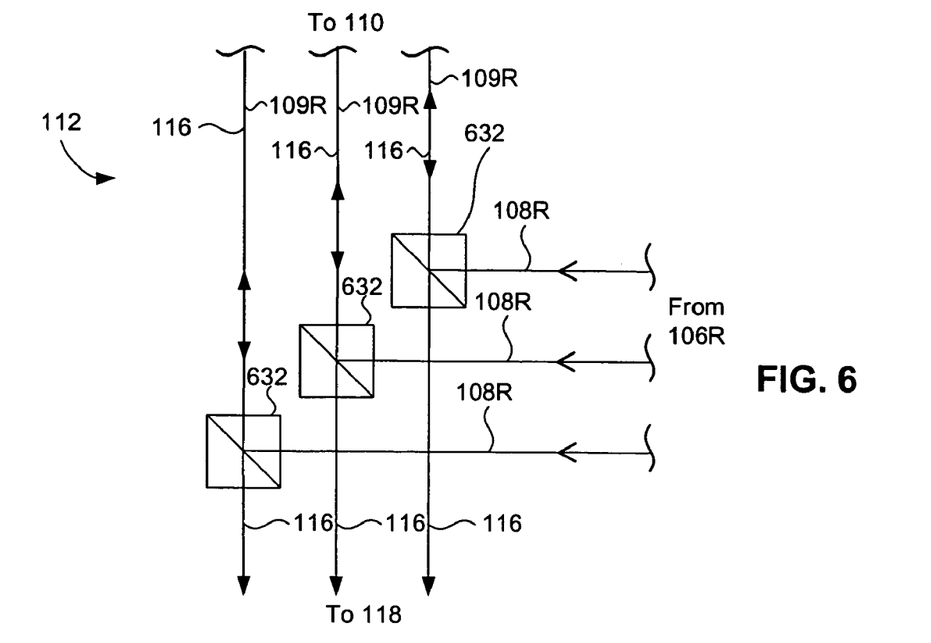
FIGS. 6 and 7 show a beam splitter system, according to respective embodiments of the present invention.
Figure 7:
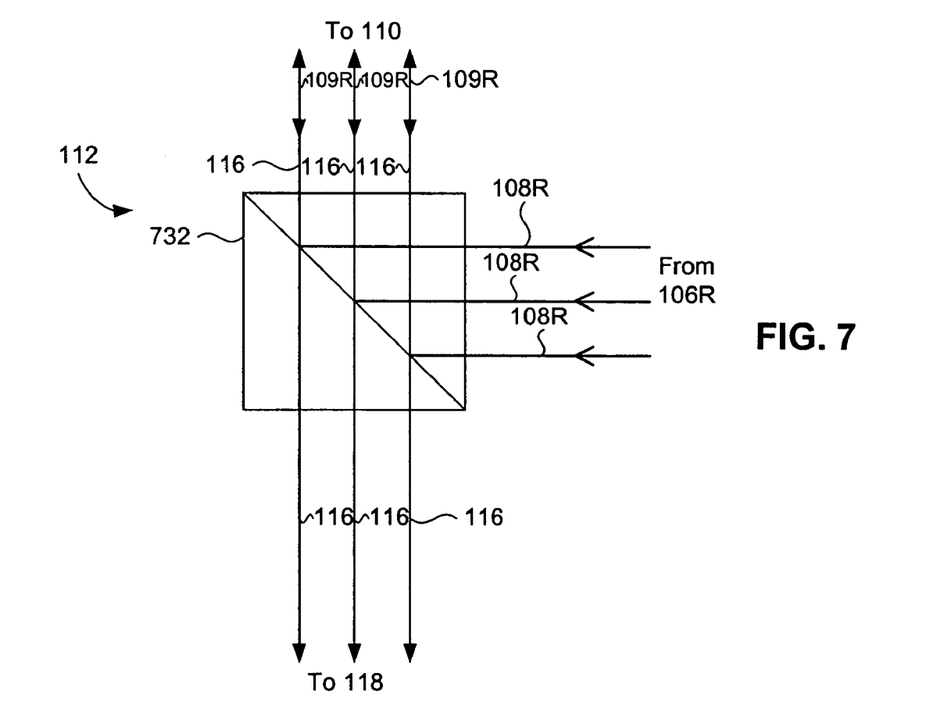

When reflective pattern generators are used, beam splitter module 112 is used in lithography system 100. FIGS. 6 and 7 show various arrangements for beam splitter module 112, according to respective embodiments of the present invention.

FIG. 6 shows beam splitter module 112, according to one embodiment of the present invention. In this embodiment, beam splitter module 112 includes a beam splitter 632 for each beam 108R that enters from illumination optics 106R. It is to be appreciate any number of beam splitters 632 can be used depending on a number of beams 108R entering beam splitter module 112, as is contemplated within the scope of the present invention.

FIG. 7 shows a beam splitter module 112, according to one embodiment of the present invention. In this embodiment, beam splitter module 112 includes a single beam splitter 732, which directs each beam 108R that enters from illumination optics 106R.

It is to be appreciated that other configurations can also be used for beam splitter module 112, such as a combination of larger beam splitters that direct a plurality of beams and smaller beam splitter that directs a single beam. All variations and permutations are contemplated within the scope of the present invention.

Exemplary Pattern Generator System Module

Figure 8:
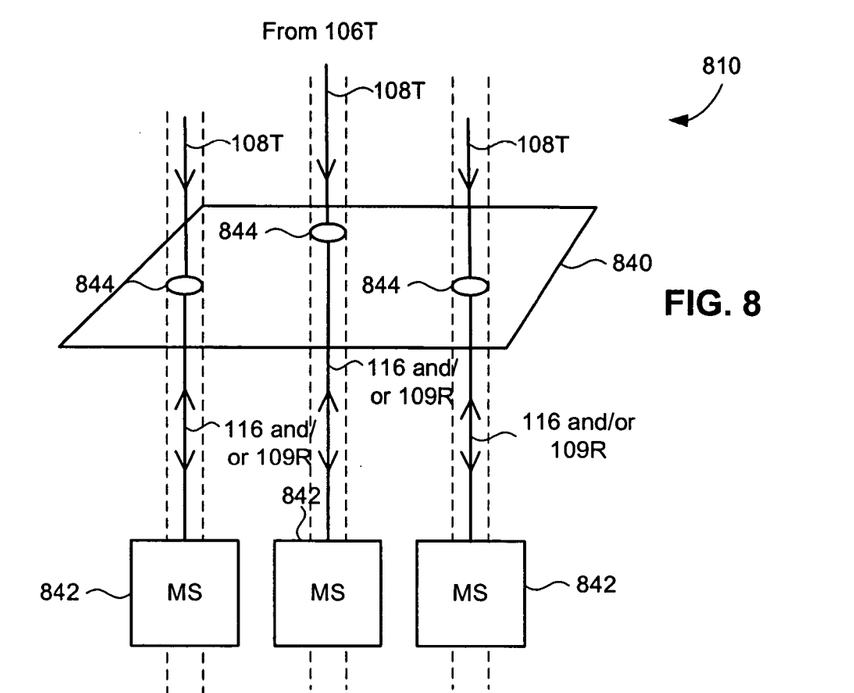
FIGS. 8, 9, and 10 show a pattern generator system, modules according to respective embodiments of the present invention.
Figure 9:
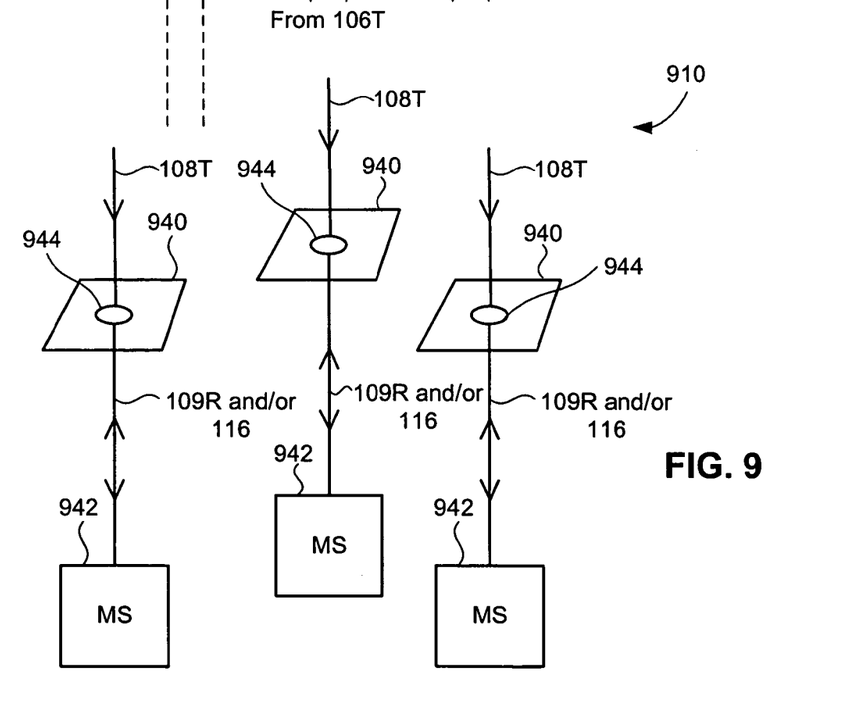
Figure 10:
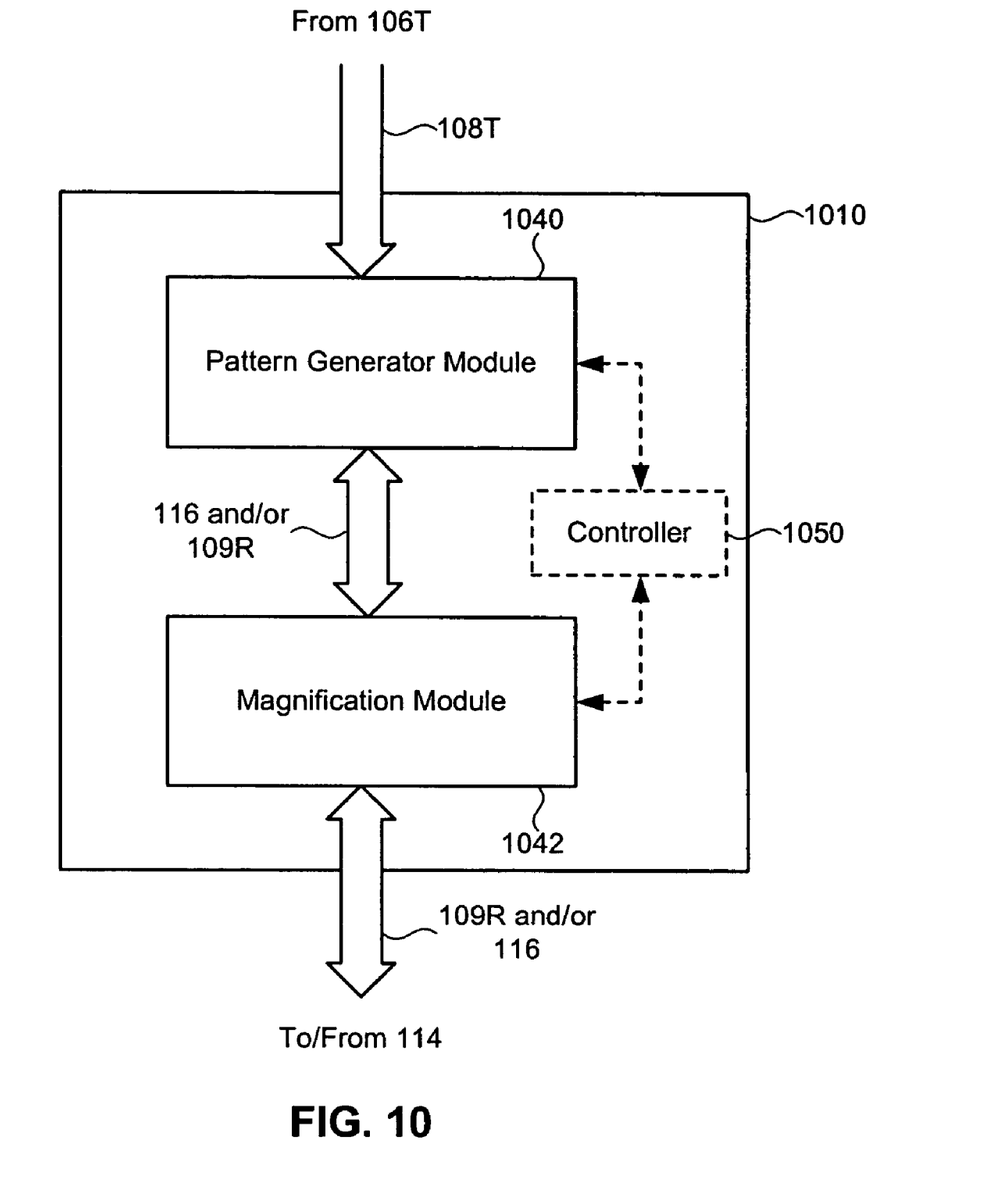

FIGS. 8, 9, and 10 show various configurations for pattern generator system module 110, according to respective embodiments of the present invention. According to the respective embodiments of the present invention, each pattern generator system module 110 can include one or more pattern generators. Either each pattern generator or parts of each pattern generator are aligned with one or more corresponding magnification devices in magnification systems, which provides varying magnifications across an object plane. A magnification is chosen for each pattern generator, or part thereof, based on what size and resolution of a feature or features is being patterned by a respective pattern generator, or part thereof, on a substrate.

Using this module scheme, various sized features can be patterned at a same time, which increases throughput of the lithography system 100 compared to a conventional system that has a fixed magnification across the object plane, for reasons discussed above. Also, using this module scheme, lithography system 100 is capable of being customized for various magnifications, numerical apertures, resolutions, and/or working distances between various elements of system 100. Although both beams 108T and 109R are shown in the figures, only one will actually be used during each exposure operation, which depends on the type of pattern generator (transmissive or reflective) being used.

FIG. 8 shows pattern generator system module 810, according to one embodiment of the present invention. Pattern generator system module 810 includes a pattern generator 840 and a plurality of magnification systems 842, each having a same or different magnification, depending on what part 844 of pattern generator 840 is being projected onto substrate 122. In one example, as discussed above, pattern generator 840 includes a matrix of active areas, where each active area is part 844. Part 844 can be a single pixel, active area, or the like, or can be a group of pixels, active areas, or the like, depending on an application of lithography system 100. Using multiple magnification systems 842 allows for light channels (shown as dashed columns) to be formed through pattern generator system module 810. In one embodiment, the light channels can extend through beam splitter module 112 and projection system module 118. In that embodiment, the light channels can either be converged or remain separate when beam 120 patterns substrate 122.

FIG. 9 shows a pattern generator system module 910, according to one embodiment of the present invention. Pattern generator system module 910 includes an array of pattern generators 940 each aligned with a respective magnification system 942 in an array of magnification systems. In this embodiment, each pattern generator 940 is designated to produce a feature or features having certain characteristics (e.g., size, resolution, etc), which are produced using a respectively chosen magnification system 942. Also, in one embodiment, through the use of an array of pattern generators 942, all, or substantially all, of substrate 122 (not shown) can be patterned substantially simultaneously with features having various sizes and various other characteristics. This can increase throughput compared to a conventional system that had a fixed magnification and could only pattern one sized feature at a time.

FIG. 10 shows a pattern generator system module 1010, according to one embodiment of the present invention. Pattern generator system module 1010 includes a pattern generator module 1040 and a magnification module 1042. Optionally, a controller 1050 can be used to align appropriate pattern generators or parts thereof (not shown), in pattern generator module 1040 and corresponding magnification devices (not shown) in magnification module 1042 to form features have desired characteristics (e.g., resolution, size, etc.). For example, pattern generators 940 or parts thereof 944 in FIG. 9 can be aligned with elements 942 in FIG. 9. In this way, aligning of appropriate parts of pattern generator module 1040 and magnification module 1042 can be done dynamically between each exposure cycle, between substrates, or the like.

For example, in one embodiment, one or more characteristics about a pattern generator's pattern in pattern generator module 1040 are determined and magnification devices in magnification module 1042 are rotated to properly align a desired magnification device with the pattern generator, or part thereof.

For example, a set of magnification systems 842, 942, or in 1042 can be used to provide for a low numerical aperture (NA), which decreases resolution, and produces a larger feature, while another set of magnifications systems 842, 942, or in 1042 can be used to provide for a high NA, which increases resolution, and produces a small feature. The arrangement of the sets can be determined by individual users for individual applications of system 100, and can be easily modified by merely exchanging one pattern generator system module 110 for another pattern generator system module 110.

Exemplary Projection System Modules

Figure 11:
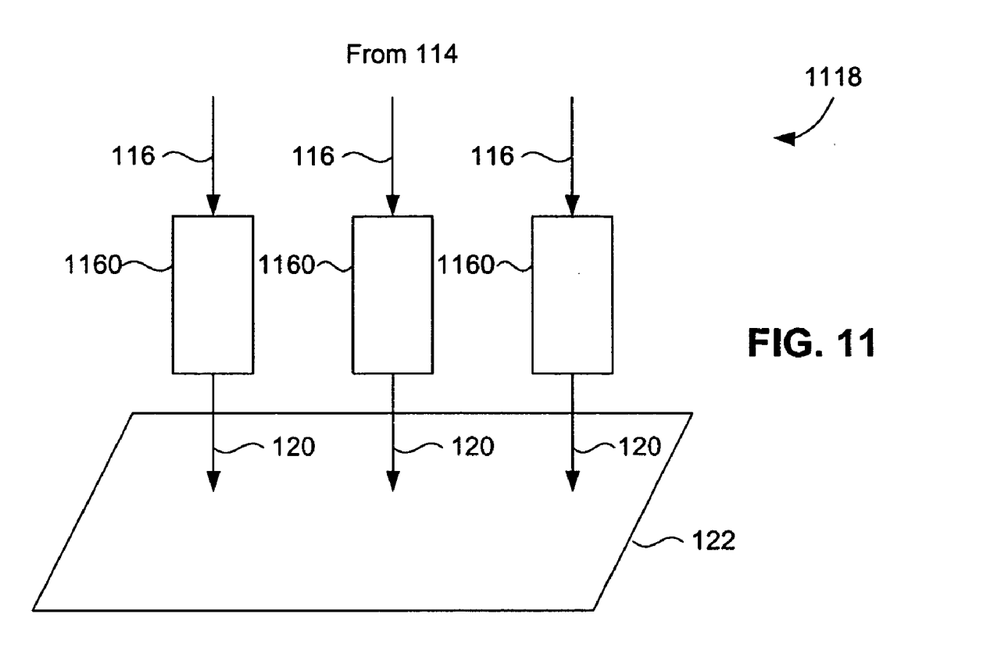
FIGS. 11 and 12 show projection system modules, according to respective embodiments of the present invention.
Figure 12:
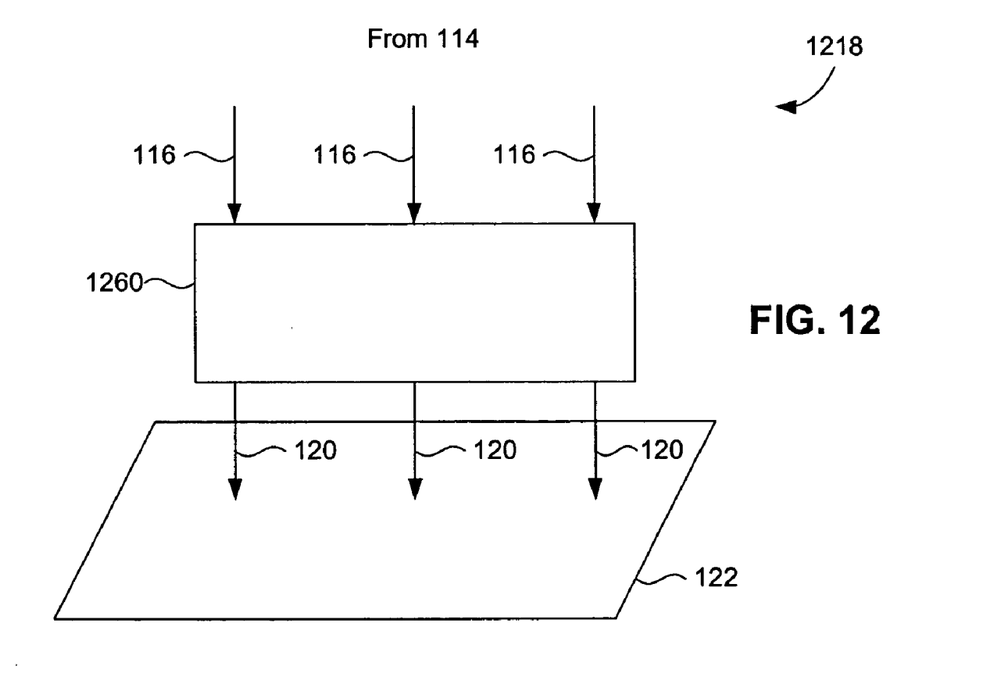

FIGS. 11–12 show exemplary projection system modules 1118 and 1218, respectively, according to respective embodiments of the present invention.

FIG. 11 shows projection system module 1118 that has individual projection optics 1160 for each channel (as discussed above) established in pattern generator module 110. Projection optics 1160 can include one or more lenses or mirrors, or combinations thereof. Although only three projection optics 1160 are shown, any number can be used, for example, a number of projection optics 1160 can be chosen so that an entire surface of substrate 122 is patterned at substantially a same time.

FIG. 12 show projection system module 1218 that has projection optics 1260, which process all patterned beams 116 therein. Although only shown processing three pattern beams 116, any number of patterned beams 116 can be processed. For example, a number of patterned beams 116 can be chosen so that an entire surface of substrate 122 is patterned at substantially a same time.

It is to be appreciated that other configurations can also be used for projection system module 118, where all variations and permutations are contemplated within the scope of the present invention.

Exemplary Application

Figure 13:
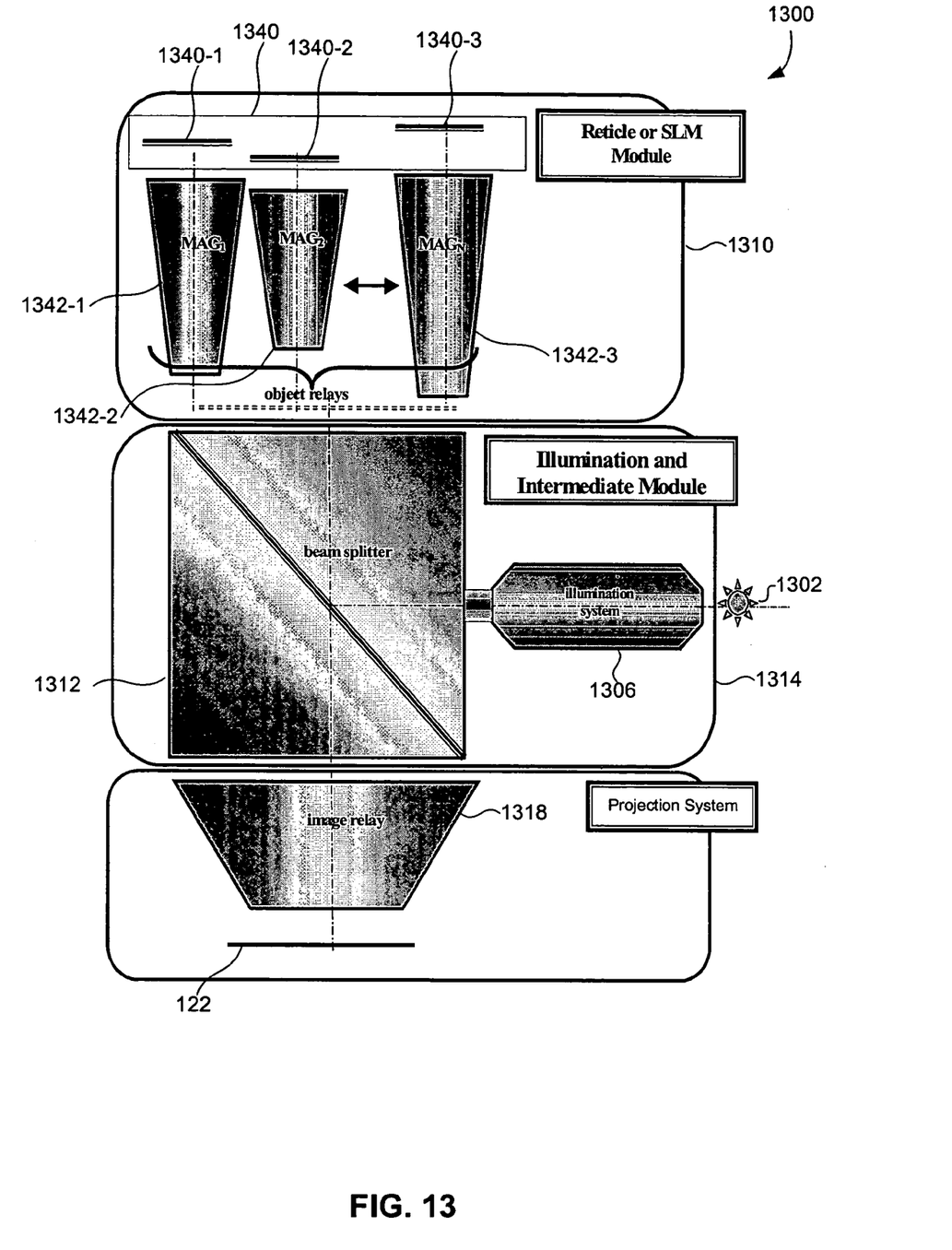
FIG. 13 shows a lithography system according to one embodiment of the present invention.

FIG. 13 shows an exemplary application for a lithography system 1300 according to one embodiment of the present invention. Lithography system 1300 can be similar in overall configuration as lithography system 100. A light source 1302 generates a beam that is processed in an intermediate module 1314 using an illumination system 1306 before being directed by a beam splitter 1312 towards a pattern generator system module 1310. In pattern generator system module 1310, the beam is transmitted through a respective single magnification device 1342-$n$ ($n$=1, 2, . . . ) to and from reflective pattern generator 1340-$n$ in pattern generator module 1340. The patterned beam passes through beam splitter 1312 and is directed using projection system module 1318 such that it patterns substrate 122.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system, comprising:
a first module including a set of pattern generating devices;
a second module including a set of magnification changing devices having different magnifications, each of the magnification changing devices being aligned with a corresponding one of the pattern generating devices based on a correlation between a characteristic of the pattern generating devices and the magnification of the magnification changing devices;
a third module including a set of illuminating devices;
a fourth module including a set of projection optical devices; and
a substrate that receives exposure light beams from the fourth module,
wherein the set of illuminating devices in the third module is configured to direct illumination through the set of magnification changing devices in the second module to reflect the illumination from the set of pattern generating devices in the first module, and
wherein the reflected light passes back through the set of magnification changing devices in the second module and is directed by the set of illuminating devices in the third module onto the set of projection optical devices in the fourth module.

2. The system of claim 1, wherein at least one of the sets comprises more than one of the respective devices.

3. The system of claim 1, wherein at least two of the modules have a same number of respective devices.

4. The system of claim 1, wherein the set of pattern generating devices comprises at least one of reticles, spatial light modulators, contrast devices, grating light valves, digital mirror devices, and liquid crystal display devices.

5. The system of claim 1, wherein the set of magnification changing devices comprises one or more optical devices.

6. The system of claim 5, wherein the one or more optical devices comprise lenses.

7. The system of claim 1, wherein light beams travel through a plurality of light channels in respective ones of the sets of devices.

8. The system of claim 1, wherein the characteristics of the set of pattern generating devices correspond to a desired resolution of a pattern generated by the set of pattern generating devices.

9. The system of claim 1, wherein the first and second modules are combined into a single module.

10. The system of claim 1, wherein the set of illumination devices comprises:
   at least one illumination optical system; and
   at least one beam splitter.

11. The system of claim 1, wherein an entire surface of the substrate receives the exposure light beams substantially simultaneously.

12. The system of claim 1, further comprising:
   a detector that detects the individual characteristics of each of the pattern generating devices in the first module and that produces respective result signals therefrom; and
   a controller that uses the respective result signals to control which of the magnification changing devices in the second module is aligned with which of the pattern generating devices in the first module based on the respective magnification of the magnification changing device.

13. The system of claim 12, wherein the controller is configured to rotate respective ones of the magnification changing devices to align them with corresponding ones of the pattern generating devices.

14. The system of claim 1, wherein the third module receives a beam of radiation from a radiation source.

15. The system of claim 1, wherein the third module receives a beam of radiation from a plurality of radiation sources.

16. The system of claim 1, wherein the third module receives a plurality of beams of radiation from a first end of a light divider that receives radiation from a radiation source at a second end of the light divider.

17. The system of claim 16, wherein the light divider comprises a single-in-multiple-out waveguide.

18. The system of claim 16, wherein the divider comprises a set of optical elements.

19. A system, comprising:
   a set of pattern generators;
   a set of magnification changing devices having a same number of magnification changing devices as pattern generators in the set of pattern generators and having different magnifications; and
   a controller that is configured to determine a characteristic of each of the pattern generators and move a correlating one of the magnification changing devices to align with a corresponding one of the pattern generators based on the characteristic of the corresponding one of the pattern generators;
   an illumination system;
   an optical system; and
   a projection system,
   whereby radiation generated by the illumination system is directed by the optical system through respective ones of the magnification changing devices onto corresponding ones of the set of pattern generators to form patterned light beams, and
   whereby the patterned light beams are directed by the optical system onto the projection system to be projected by the projection system onto a substrate.

20. The system of claim 19, wherein the set of pattern generators comprises one of static pattern generators and dynamic pattern generators.

21. The system of claim 20, wherein the static pattern generators comprise one of reticles, masks, and photomasks.

22. The system of claim 20, wherein the dynamic pattern generators comprise one of digital mirror devices, liquid crystal displays, and grating light valves.

23. The system of claim 19, wherein the magnification changing devices comprise one or more optical devices.

24. The system of claim 23, wherein the one or more optical devices comprises lenses.

25. A method, comprising:
   (a) determining a characteristic of each patterning device in a plurality of patterning devices;
   (b) aligning a corresponding magnification changing device in a plurality of magnification changing devices, having different magnifications, with a respective one of the patterning devices in the plurality of patterning devices based on step (a);
   (c) directing light through the plurality of magnification changing devices onto respective ones of the plurality of patterning devices to pattern the light; and
   (d) projecting the patterned light onto a substrate.

* * * * *